United States Patent
Chiba et al.

(10) Patent No.: US 6,547,879 B1
(45) Date of Patent: *Apr. 15, 2003

(54) ELECTRODE FORMING APPARATUS FOR ELECTRIC PARTS

(75) Inventors: Minoru Chiba, Tokyo-To (JP); Akira Saito, Tokyo-To (JP); Fukashi Ogasawara, Tokyo-To (JP); Isao Kobayashi, Tokyo-To (JP)

(73) Assignee: Tokyo Weld Co., Ltd., Tokyo-To (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/567,321

(22) Filed: May 9, 2000

(30) Foreign Application Priority Data

Dec. 8, 1999 (JP) .......................... 11-348802

(51) Int. Cl.$^7$ ................................ B05C 1/08
(52) U.S. Cl. ........................ 118/210; 118/239; 118/262; 118/503
(58) Field of Search ............................... 118/210, 212, 118/221, 226, 227, 235, 239, 261, 262, 58, 503; 156/361, 539, 578; 427/123, 383.7; 206/713, 716, 820

(56) References Cited

U.S. PATENT DOCUMENTS

| 3,129,814 | A |   | 4/1964  | Cheh et al.       |         |
|-----------|---|---|---------|-------------------|---------|
| 3,231,065 | A |   | 1/1966  | Kaminski et al.   |         |
| 3,517,803 | A | * | 6/1970  | Frompovicz et al. | 206/716 |
| 4,418,815 | A |   | 12/1983 | Anderson et al.   |         |
| 4,502,589 | A |   | 3/1985  | Fichtner          |         |
| 4,526,129 | A | * | 7/1985  | Braden            | 118/503 |
| 4,533,038 | A |   | 8/1985  | Richard           |         |
| 4,540,088 | A |   | 9/1985  | Bergh             |         |
| 4,588,066 | A |   | 5/1986  | Kaminski          |         |
| 4,693,370 | A |   | 9/1987  | Aceti             |         |
| 4,747,479 | A |   | 5/1988  | Herrman           |         |
| 4,936,442 | A |   | 6/1990  | Von Till          |         |
| 4,946,028 | A |   | 8/1990  | Eichmann et al.   |         |
| 5,113,701 | A |   | 5/1992  | Martin            |         |
| 5,113,785 | A |   | 5/1992  | Martin            |         |
| 5,125,503 | A |   | 6/1992  | Ueberreiter et al.|         |
| 5,132,160 | A | * | 7/1992  | Bird              | 428/159 |
| 5,191,693 | A |   | 3/1993  | Umetsu            |         |
| 5,197,259 | A |   | 3/1993  | Menayan           |         |
| 5,287,957 | A |   | 2/1994  | Iuchi et al.      |         |
| 5,364,014 | A | * | 11/1994 | Hamuro et al.     | 228/248.1 |
| 5,484,052 | A |   | 1/1996  | Pawloski et al.   |         |
| 5,630,499 | A |   | 5/1997  | Louden et al.     |         |
| 5,944,897 | A | * | 9/1999  | Braden            | 118/600 |
| 6,360,866 | B1|   | 3/2002  | Chiba et al.      |         |

FOREIGN PATENT DOCUMENTS

| JP | 62-249444 | 10/1987 |
|----|-----------|---------|
| JP | 4-225243  | 8/1992  |

* cited by examiner

*Primary Examiner*—Richard Crispino
*Assistant Examiner*—George R. Koch, III
(74) *Attorney, Agent, or Firm*—Jacobson Holman PLLC

(57) ABSTRACT

An electrode forming apparatus for electric parts has a tape and a driving mechanism. The tape has holding holes for holding board-shaped electric parts therein at regular intervals and feeding holes for feeding the tape at regular intervals. The driving mechanism can feed the tape by engaging with the feeding holes of the tape. A pasting unit applies electric conductive paste to the electric parts held by the holding holes of the tape fed by the driving mechanism, in order to form a electrode. Each of the holding holes has a pair of abutting edges for abutting on both opposite surfaces of the board-shaped electric parts and at least one cutout portion formed from the butting edges. Due to the above constitution, the board-shaped electric parts can be held and conveyed by the abutting edges of the holding hole.

17 Claims, 6 Drawing Sheets

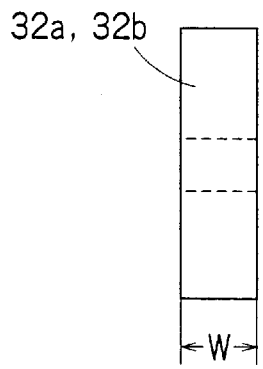
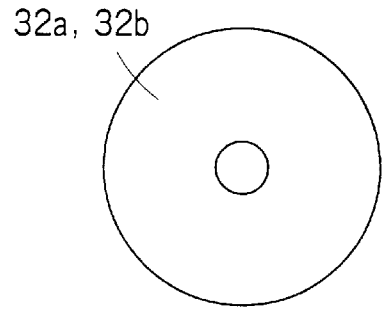
F I G. 5A      F I G. 5B
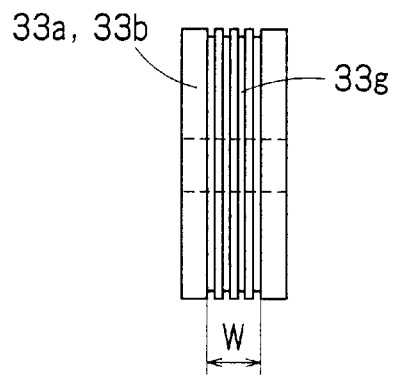
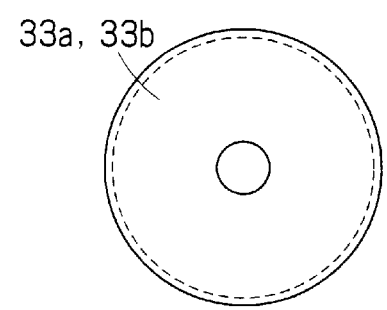
F I G. 6A      F I G. 6B
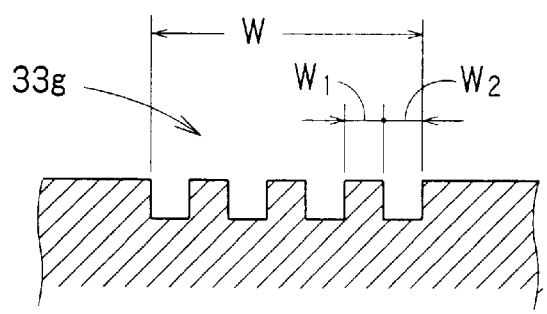
F I G. 7

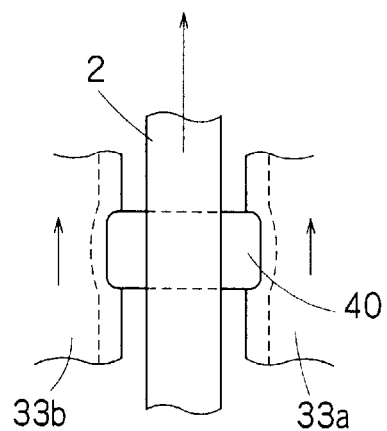
FIG. 8
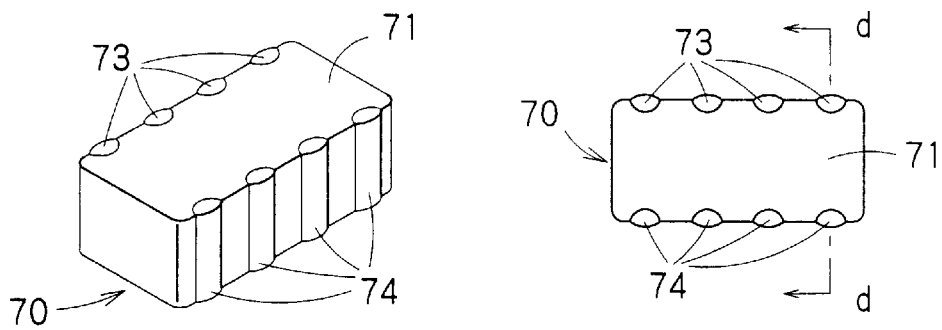
FIG. 9A                FIG. 9B
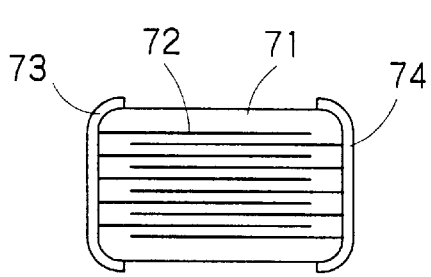   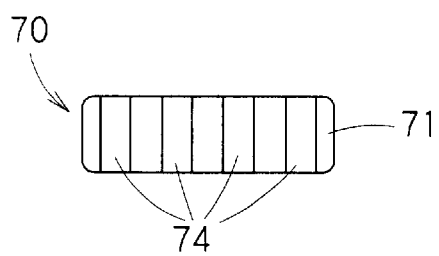
FIG. 9D                FIG. 9C

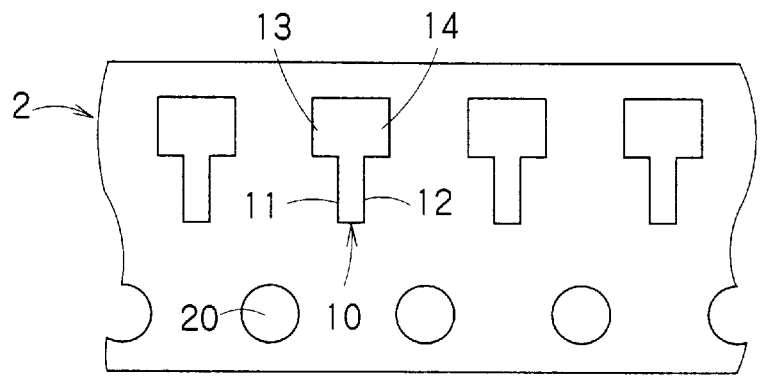
FIG. 10
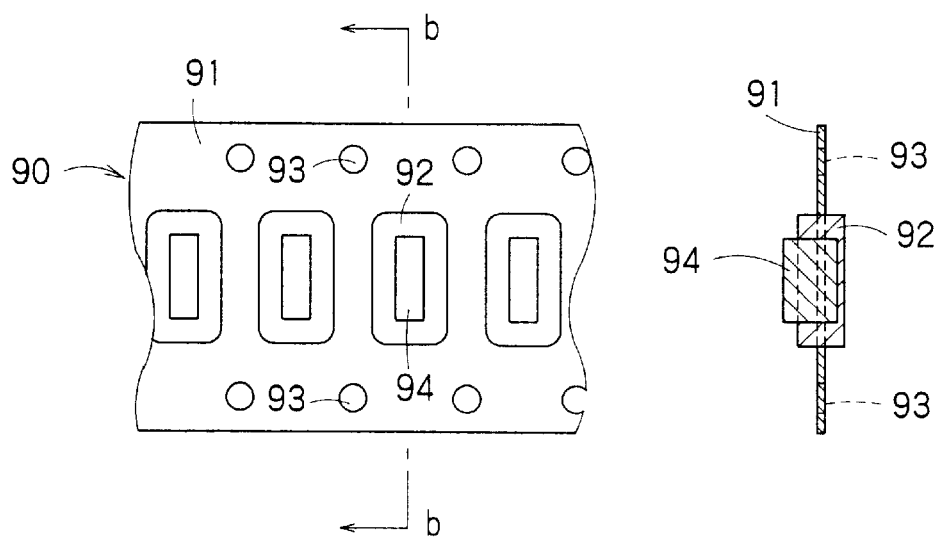
FIG. 11A
Prior Art
FIG. 11B
Prior Art

ELECTRODE FORMING APPARATUS FOR ELECTRIC PARTS

BACKGROUND OF THE INVENTION

1. Field of the Invention

This invention relates to an electrode forming apparatus for electric parts, in particular, to an electrode forming apparatus that can easily form electrodes on board-shaped electric parts in turn by conveying the board-shaped electric parts with their attitudes kept fixed.

2. Description of the Related Art

In the prior art, electric parts are conveyed by a conveying tape that is intermittently moved.

When electrodes have to be provided on the electric parts, the electric parts are sent to an electrode forming apparatus. The electric forming apparatus carries out a predetermined electrode-forming operation to the electric parts.

In order to improve the efficiency of the electrode-forming operation, it is preferable that the electrode-forming operation is carried out to the electric parts remaining held by the conveying tape, that is, without being removed from the conveying tape.

Inventors of the present invention have developed a conveying tape 90 as shown in FIGS. 11A and 11B, previous to the present invention. FIG. 11A shows a plan view of the conveying tape 90 and FIG. 11B shows a cross section view taken along b—b line of the FIG. 11A.

As shown in FIGS. 11A and 11B, the conveying tape 90 consists of a conveying tape body 91, a plurality of work holders 92 attached to the conveying tape body 91, and a plurality of feeding holes 93 formed in the conveying tape body 91. The conveying tape body 91 is made of a material hard to stretch, in order to assure highly accurate positioning thereof. However, the work holder 92 are made of elastic rubber, in order to stably hold electric parts 94 as works.

The above conveying tape 90 can hold and convey the electric part 94 as the works stably. However, because of the elasticity of the work holders 92, the electric parts 94 held by the conveying tape 90 may move away from their desired positions when electric conductive paste is directly applied thereto. Therefore, it is difficult that the electric conductive paste is applied to predetermined areas of the electric parts 94.

Inventors of the present invention have conducted many examinations and investigations. Then, they have found that a mechanism for sandwiching the electric parts 94 from both sides thereof can give substantially the same pressing force to the both sides in order to prevent the electric parts 94 from moving away from their desired positions.

However, in the conveying tape 90 described above, it is difficult to form thinner work holders 92. Thus, as shown in FIG. 11B, both ends of an electric part 94 (a work) may not protrude from both sides of a work holder 92 when the electric part 94 is low (the work is small).

SUMMARY OF THE INVENTION

The object of this invention is to solve the above problems, that is, to provide an electrode forming apparatus that can easily form electrodes on board-shaped electric parts in turn by conveying the board-like electric parts with their attitudes kept fixed.

In order to achieve the object, an electrode forming apparatus for electric parts includes: a tape having holding holes for holding board-shaped electric parts at regular intervals along a length thereof; a driving mechanism for feeding the tape in the direction of the length thereof; and a pasting unit for applying electric conductive paste to the board-shaped electric parts held by the holding holes of the tape fed by the driving mechanism, in order to form a electrode. In the case, each of the holding holes has a pair of opposite abutting edges for abutting on both opposite surfaces of the board-shaped electric parts, and at least one cutout portion formed in one of the abutting edges.

According to this invention, the board-shaped electric parts can be held by the pair of abutting edges. Thus, the electric parts can be conveyed with their attitude kept fixed regardless of adverse influences such as vibrations from the moving tape. Therefore, the electric conductive paste can be applied to predetermined areas of the electric parts more accurately without removing the electric parts from the conveying tape.

The pasting unit may have a pasting wheel that has an elastic cylindrical surface and a groove provided in the cylindrical surface. In the case, the cylindrical surface of the pasting wheel may be adapted to be deformed by the board-shaped electric parts held by the holding holes of the tape fed by the driving mechanism.

Preferably, a feeding speed of the tape and a moving speed of the cylindrical surface may be substantially identical with each other at least while the cylindrical surface is contact with the board-shaped electric parts held by the holding holes of the tape fed by the driving mechanism.

The pasting wheel may rotate continuously at a substantially constant speed. Alternatively, the pasting wheel may rotate intermittently.

The pasting wheel may have a plurality of parallel grooves provided in the cylindrical surface.

Preferably, the pasting unit may have a pair of pasting wheels. In the case, each of the pair of pasting wheels may have an elastic cylindrical surface and a groove provided in the cylindrical surface. In addition, the pair of pasting wheels may be arranged in such a manner that the cylindrical surfaces of the pasting wheels can sandwich the board-shaped electric parts held by the holding holes of the tape fed by the driving mechanism. In addition, each of cylindrical surfaces of the pasting wheels may be adapted to be deformed by the board-shaped electric parts held by the holding holes of the tape fed by the driving mechanism.

Preferably, a feeding speed of the tape and respective moving speeds of the cylindrical surfaces of the pair of pasting wheels may be substantially identical at least while the cylindrical surfaces are contact with the board-shaped electric parts held by the holding holes of the tape fed by the driving mechanism.

The pair of pasting wheels may rotate continuously at a substantially constant speed. Alternatively, the pair of pasting wheels may rotate intermittently.

Each of the pasting wheels may have a plurality of parallel grooves provided in the cylindrical surface.

For example, the tape is made of paper.

Preferably, the pair of abutting edges are parallel with each other.

Preferably, the cutout portion is formed in a central portion of each of the abutting edges so that each of the holding holes is cross-shaped.

Alternatively, the cutout portion may be formed in an end portion of each of the abutting edges so that each of the holding holes is T-shaped.

Preferably, the tape has feeding holes at regular intervals along the length thereof and the driving mechanism has engaging means for engaging the feeding holes for feeding operation.

Preferably, a drying unit is provided for drying the electric conductive paste applied to the board-shaped electric parts by the pasting unit.

BRIEF DESCRIPTION OF THE DRAWINGS

FIG. 5A is a front view of a paste-supplying wheel shown in FIG. 4;

FIG. 5B is a side view of the paste-supplying wheel shown in FIG. 5A;

FIG. 6A is a front view of a paste-applying wheel shown in FIG. 4;

FIG. 6B is a side view of the paste-applying wheel shown in FIG. 6A;

FIG. 7 is a sectional view of grooves of the paste-applying wheel shown in FIG. 6A;

FIG. 8 is an explanation view of a paste-applying operation by the pasting unit shown in FIG. 4;

FIG. 9A is a perspective view of a electric part;

FIG. 9B is a plan view of the electric part shown in FIG. 9A;

FIG. 9C is a side view of the electric part shown in FIGS. 9A and 9B;

FIG. 9D is a cross section view taken along d—d line of the FIG. 9B;

FIG. 10 is a plan view of another tape;

FIG. 11A is a plan view of a conventional conveying tape; and

FIG. 11B is a cross section view taken along b—b line of the FIG. 11A.

DETAILED DESCRIPTION OF THE INVENTION

An embodiment of the invention will now be described in more detail with reference to drawings.

Figure 1:
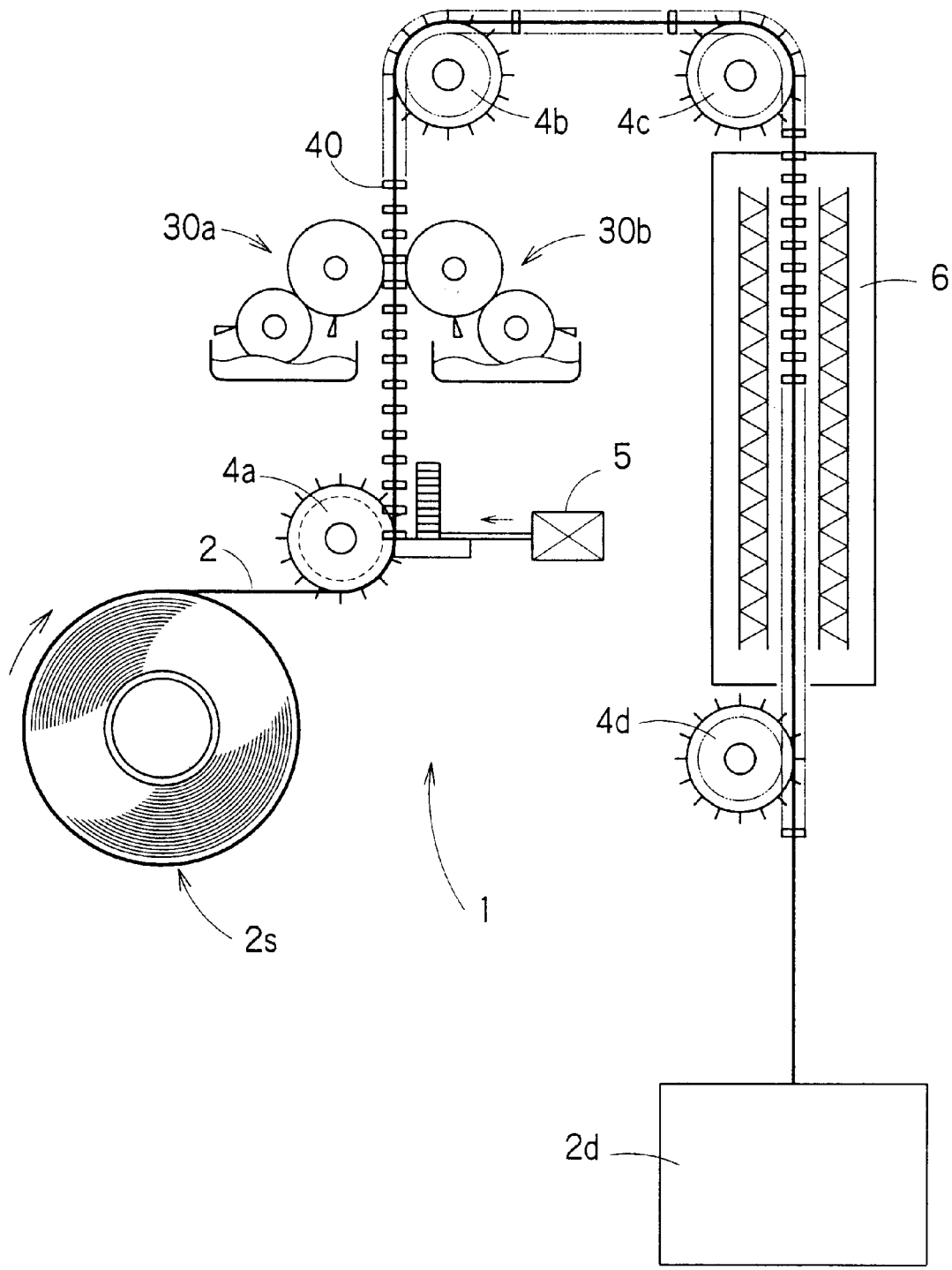
FIG. 1 is a schematic view of a first embodiment of the electrode forming apparatus for electric parts according to the invention.

FIG. 1 shows schematically a first embodiment of the electrode forming apparatus for electric parts according to the invention. As shown in FIG. 1, the electrode forming apparatus 1 includes a tape 2 which has holding holes 10 for holding board-shaped electric parts 40 therein, at regular intervals in the longitudinal direction of the tape (see FIG. 2A). The electrode forming apparatus 1 also includes driving mechanisms 4a to 4d for feeding the tape 2 in the longitudinal direction of the tape 2.

The tape 2 is set at a tape introducing part 2s in a wound roll-like state. A tip of the tape 2 is guided to a tape discharging part 2d through the driving mechanisms 4a to 4d. Not all of the driving mechanisms 4a to 4d have to be individual driving mechanisms. For example, only one of the driving mechanisms 4a to 4d may be an individual driving mechanism and the others may be follower mechanisms.

As shown in FIG. 1, above a conveying path formed by the tape 2, there are a supply unit 5 for inserting the board-shaped electric parts 40 into the holding holes 10 of the tape 2; pasting sub units 30a and 30b (a pasting unit) for applying electric conductive paste to the electric parts 40 held by the holding holes 10; and a drying unit 6 for drying the electric conductive paste applied to the electric parts 40 by the pasting sub units 30a and 30b.

Figures 2A, 2B:
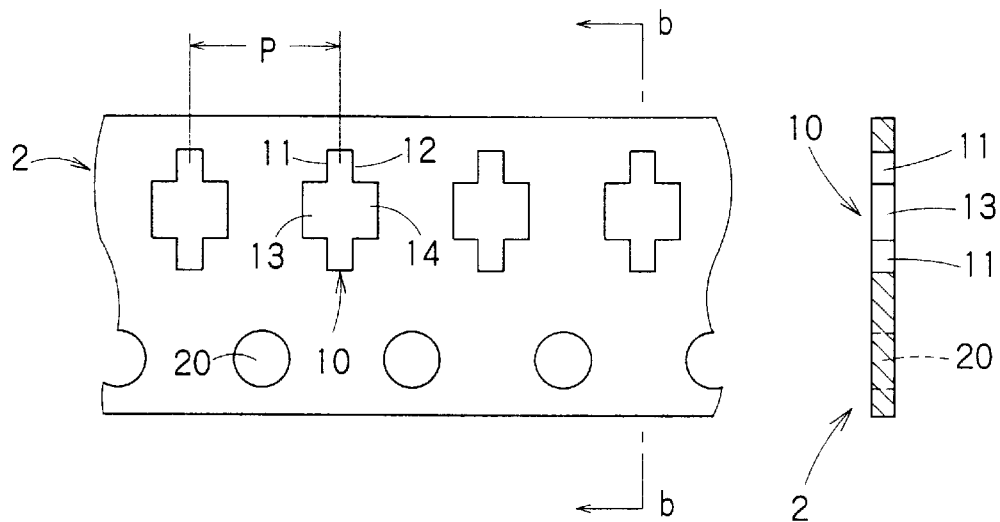
FIG. 2A is a plan view of a tape shown in FIG. 1.
FIG. 2B is a cross section view taken along b—b line of the FIG. 2A.
Figures 3A, 3B:
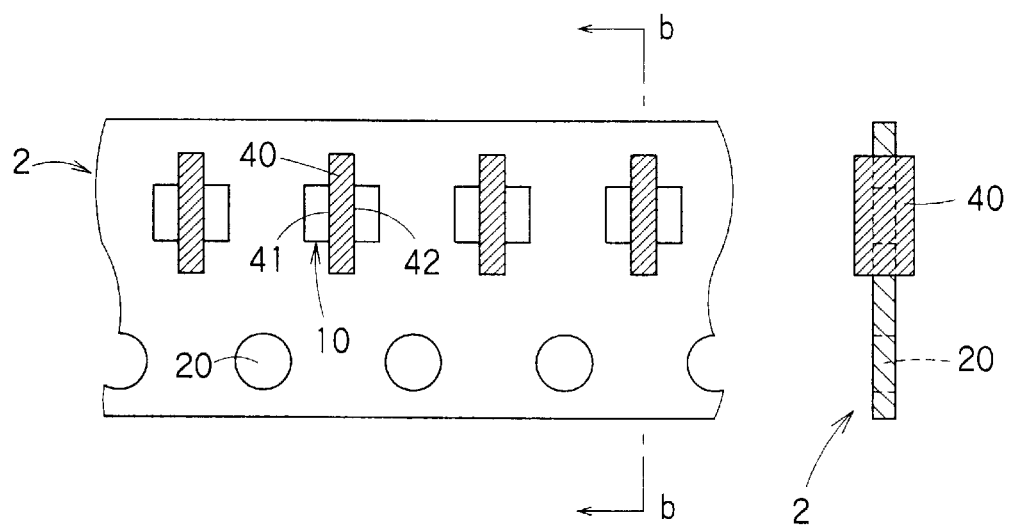
FIG. 3A is a plan view of the tape holding electric parts.
FIG. 3B is a cross section view taken along b—b line of the FIG. 3A.

FIG. 2A shows a plan view of the tape 2 shown in FIG. 1, and FIG. 2B is a cross section view taken along b—b line of the FIG. 2A. FIG. 3A is a plan view of the tape 2 while the tape 2 is holding electric parts 40, and FIG. 3B is a cross section view taken along b—b line of the FIG. 3A.

As shown in FIGS. 2A and 3A, each of the holding holes 10 has a pair of abutting edges 11, 12 for abutting on opposite surfaces 41, 42 of the board-shaped electric parts 40. Cutout portions 13 and 14 are formed by recessing opposite portions of the abutting edges 11 and 12.

In this embodiment, the cutout portions 13 and 14 are formed in rectangular-shape at substantially the central portions of the abutting edges 11 and 12. As a result, the holding holes 10 are cross-shaped.

In this embodiment, the tape 2 has also feeding holes 20 at regular intervals in the longitudinal direction of the tape 2. Each of the driving mechanisms 4a to 4d has an engaging element such as a pinned wheel having radial pins that engage with the feeding holes 20 of the tape 2 respectively. The feeding holes 20 are formed in small circular holes.

Figure 4:
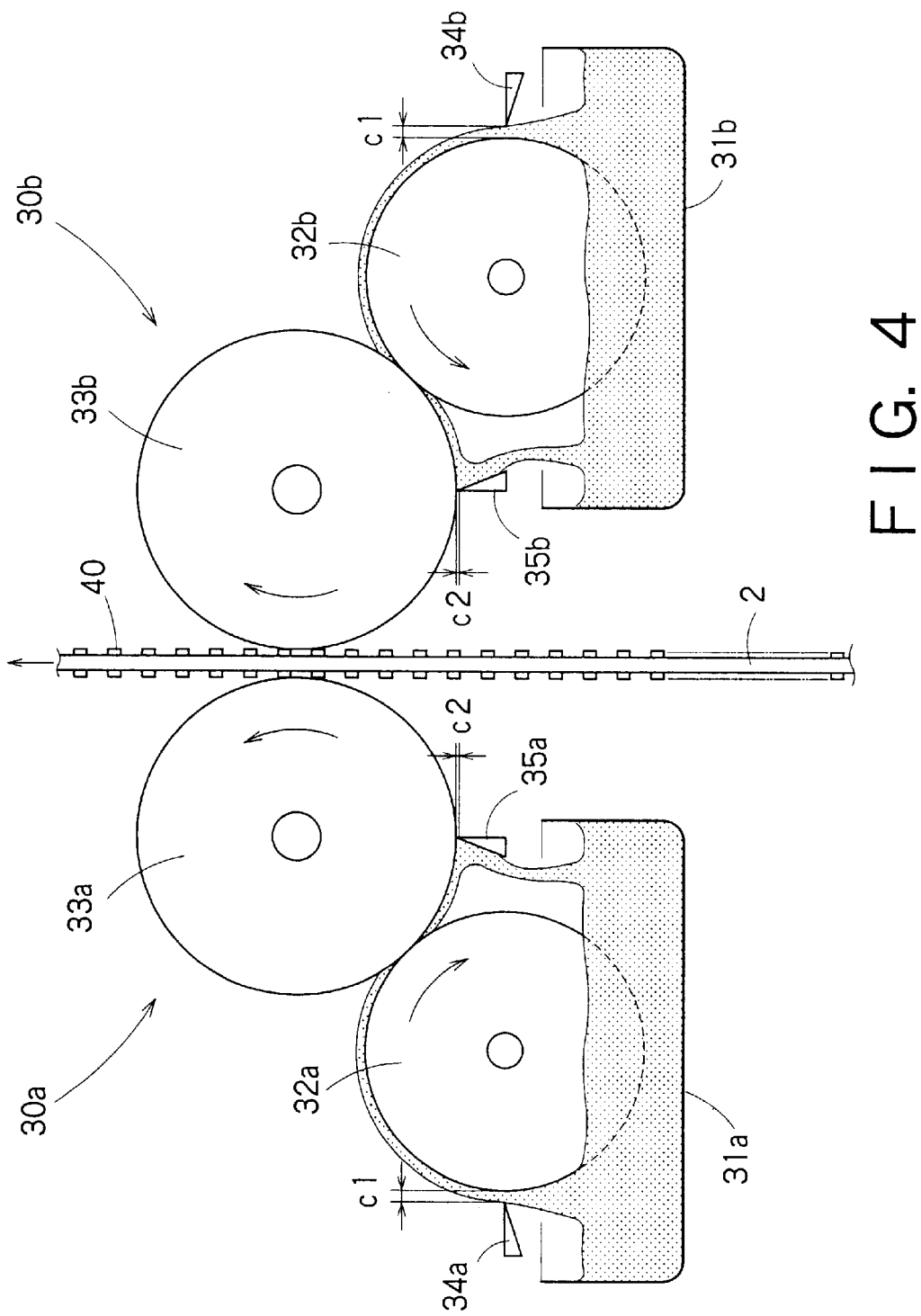
FIG. 4 is a schematic view of a pasting unit shown in FIG. 1.

FIG. 4 shows a schematic view of a pasting unit consisting of pasting sub units 30a and 30b. As shown in FIG. 4, the pasting sub units 30a and 30b are arranged on both sides with respect to the tape 2. Each of the pasting sub units 30a, 30b has a paste-applying wheel (pasting wheel) 33a, 33b, a paste container 31a, 31b for storing the electric conductive paste, and a paste-supplying wheel 32a, 32b for supplying a suitable amount of the electric conductive paste from the paste container 31a, 31b onto the paste-applying wheel 33a, 33b.

For example, the paste-supplying wheels 32a and 32b are made of a metal. As shown in FIGS. 5A and 5B, each of the paste-supplying wheels 32a and 32b has a flat cylindrical surface, and is arranged in such a manner that substantially two fifth of the cylindrical surface go into the paste container 31a or 31b.

The paste container 31a, 31b is filled with the electric conductive paste. The electric conductive paste is taken out from the paste container 31a, 31b in such a way that the electric conductive paste adheres to the cylindrical surface of the paste-supplying wheel 32a, 32b because of its own viscosity when the paste-supplying wheel 32a, 32b rotates.

Above an orbit of the cylindrical surface from the paste container 31a, 31b to an area contacting with the paste-applying wheel 33a, 33b, a first doctor 34a, 34b is provided at a predetermined distance C1 from the orbit of the cylindrical surface. Preferably, the distance C1 is changeable. The first doctor 34a, 34b is adapted to suitably adjust the amount of the electric conductive paste adhering to the cylindrical surface of the paste-supplying wheel 32a, 32b.

For example, the paste-applying wheels 33a and 33b are made of a rubber. As shown in FIGS. 6A and 6B, each of the paste-applying wheels 33a and 33b has an elastic cylindrical surface and a plurality of grooves 33g formed in the cylindrical surface of the paste-applying wheel 33a, 33b. The plurality of grooves 33g are parallel with each other.

The paste-applying wheel 33a, 33b is arranged in such a manner that the cylindrical surface of the paste-applying wheel 33a, 33b comes in contact with the cylindrical surface of paste-supplying wheel 32a, 32b under a pressure. Owing to the contact under the pressure, the electric conductive paste on the cylindrical surface of the paste-supplying wheel 32a, 32b transfers into the grooves 33g of the paste-applying wheel 33a, 33b.

In the case, as shown in FIGS. 6 and 7, each of the grooves 33g has a rectangular-shape section. An interval w1 of the grooves 33g and a width w2 of each of the grooves 33g are determined depending on electrodes that should be formed. Of course, the manner (shape, arrangement or the like) of the grooves 33g is not limited to this embodiment. In addition, in the case, as shown in FIGS. 5 and 6, a width W of a section where the grooves 33g are formed is consistent with a width of the paste-supplying wheel 32a, 32b. Thus, the electric conductive paste is adapted to be supplied into the grooves 33g more efficiently.

Above an orbit of the cylindrical surface from the area contacting with paste-supplying wheel 32a, 32b to an area contacting with the board-like electric parts 40 conveyed by the tape 2, a second doctor 35a, 35b is provided at a predetermined distance C2 from the orbit of the cylindrical surface. Preferably, the distance C2 is zero. The second doctor 35a, 35b is adapted to remove the electric conductive paste adhering to the cylindrical surface of the paste-applying wheel 33a, 33b except the grooves 33g. The distance C2 may be changeable.

The paste-applying wheels 33a and 33b are arranged in such a manner that the respective cylindrical surfaces of the paste-applying wheels can sandwich the board-shaped electric parts 40 held and conveyed by the holding holes 10 of the tape 2. The cylindrical surfaces of the paste-applying wheels 33a and 33b are adapted to come in contact with both end surfaces of the electric parts 40 under a pressure respectively. Owing to the contact under the pressure, each of cylindrical surfaces of the pasting wheels 33a and 33b is adapted to be deformed to transfer the electric conductive paste in the grooves 33g onto the both end surfaces of the electric parts 40.

The driving mechanisms 4a to 4d are adapted to move or feed the tape 2 intermittently. In this embodiment, the interval between adjacent holding holes 10 is the same as the interval between adjacent feeding holes 20. The holding holes 10 are adapted to stop at an operational position of the supply unit 5 after every intermittent movement. Therefore, the supply unit 5 are adapted to operate during each static period of the intermittent movement of the paper tape 2.

On the other hand, the pasting sub units 30a and 30b are adapted to operate during each moving period of the intermittent movement of the paper tape 2. In more detail, a feeding speed of the tape 2 and moving speeds of the cylindrical surfaces of the paste-applying wheels 33a and 33b are controlled substantially identically with each other, at least while the cylindrical surfaces are in contact with the electric parts held and conveyed by the holding holes 10 of the tape 2.

The paste-applying wheels 33a and 33b may be driven to rotate continuously at a substantially constant speed, or to rotate intermittently synchronously with the tape 2.

The tape 2 is preferably made of paper because of the convenience of manufacturing and throwing out. Of course, the tape 2 may be made of any other material that is hard to deform in a longitudinal direction thereof.

The electrode forming apparatus 1 of this embodiment operates as follows.

As shown in FIG. 1, the driving mechanisms 4a to 4d, which engage with the feeding holes 20 of the tape 2, operates to intermittently feed the holes 20 forward in turn. As a result, the tape 2 is fed forward intermittently.

When a holding hole 10 reaches at the operational position of the supply unit 5, the supply unit 5 operates to fit a board-shaped electric part 40 into the holding hole 10 during the static period of the intermittent movement. The opposite surfaces 41 and 42 of the electric part 40 are pressed between the pair of abutting edges 11 and 12 of the holding hole 10. The board-shaped electric part 40 is held in the holding hole 10 by frictional forces between the opposite surfaces 41, 42 and the abutting edges 11, 12.

The pressing force given by the supply unit 5 to insert the board-shaped electric part 40 into the holding hole 10 can be reduced because the cutout portions 13 and 14 reduce the contact area of the opposite surfaces 41, 42 with the abutting edges 11, 12.

Holding holes 10 are moved to the operational position of the supply unit 5 in turn by the intermittent movement of the paper tape 2. As shown in FIG. 1, the supply unit 5 operates to fit a board-shaped electric part 40 into each holding hole 10 during each static period of the intermittent movement.

The board-shaped electric parts 40 fitted into the holding holes 10 by the supply unit 5 are intermittently moved toward the pasting sub units 30a and 30b by the movement of the paper tape 2.

Then, in the pasting sub units 30a and 30b, the electric conductive paste filled in the paste containers 31a and 31b is taken out from the paste containers 31a and 31b in such a way that the electric conductive paste adheres to the cylindrical surfaces of the paste-supplying wheels 32a and 32b respectively when the paste-supplying wheels 32a and 32b rotate, owing to the viscosity of the elastic conductive paste.

The first doctors 34a and 34b suitably adjust the amount of the electric conductive paste adhering to the cylindrical surfaces of the paste-supplying wheels 32a and 32b, respectively.

Then, the cylindrical surfaces of the paste-applying wheels 33a and 33b come in contact with the cylindrical surfaces of paste-supplying wheels 32a and 32b under a pressure, respectively. Owing to the contact under the pressure, the electric conductive paste on the cylindrical surfaces of the paste-supplying wheels 32a and 32b transfer into the grooves 33g of the paste-applying wheels 33a and 33b, respectively.

Then, the second doctors 35a and 35b remove the electric conductive paste adhering to the cylindrical surfaces of the paste-applying wheels 33a and 33b except the grooves 33g, respectively.

As shown in FIG. 3, the board-like electric parts 40 are held by the tape 2 in such a way that both end surfaces of each of the electric parts 40 protrude from both sides of the tape 2. The electric parts 40 are moved toward the pasting sub units 30a and 30b. Each of the cylindrical surfaces of the paste-applying wheels 33a and 33b comes in contact with each of the both end surfaces of the electric parts 40 under the pressure respectively, during each moving period of the intermittent movement of the paper tape 2. Owing to the contact under the pressure, each of cylindrical surfaces of the paste-applying wheels 33a and 33b is deformed to transfer the electric conductive paste in the grooves 33g onto the both end surfaces of the electric parts 40. Depending on degree of the deformation of the paste-applying wheels 33a and 33b, the electric conductive paste may be also applied to corners of the end surfaces and side surfaces of the electric parts 40 (see FIG. 9).

As the feeding speed of the tape 2 and the respective moving speeds of the cylindrical surfaces of the paste-applying wheels 33a and 33b are substantially identical with each other, the paste can be transferred smoothly.

In the case, the paste is transferred from the plurality of parallel grooves 33g onto both end surfaces of the electric parts 40. That is, a plurality of parallel electrodes can be formed on both end surfaces of the electric parts 40 at once.

The electric parts 40 applied the electric conductive paste by the pasting sub units 30a and 30b are intermittently moved forward toward the drying unit 6 by the movement of the paper tape 2. When the electric parts 40 pass through the drying unit 6, the applied electric conductive paste congeals and adheres to the electric parts 40 to become electrodes.

A ceramics condenser is an example of the electric part that has electrodes formed by the above embodiment of the invention. FIG. 9A is a perspective view of the ceramics condenser 70. FIG. 9B is a plan view of the ceramics condenser 70. FIG. 9C is a side view of the ceramics condenser 70. FIG. 9D is a cross section view taken along d—d line of the FIG. 9B.

As shown in FIGS. 9A to 9D, the ceramics condenser 70 includes a plurality of layered ceramics base plates 71, and a plurality of electrode plates 72 each of which is inserted between each adjacent two base plates. Alternate electrode plates 72 appear from one end surface of the ceramics base plates 71. The other alternate electrode plates 72 appear from the other end surface of the ceramics base plates 71. Terminal electrodes 73 and 74 are formed on both of the one and the other end surfaces of the ceramics base plates 71.

The plurality of electrode plates 72 and the terminal electrodes 73 and 74 form a circuit. In the case, as shown in FIGS. 9A to 9D, four sets of the circuits are formed independently.

According to the above embodiment, the board-shaped electric parts 40 can be held owing to the frictional forces between itself and the pair of abutting edges 11 and 12 of the holding hole 10. Thus, the pasting sub units 30a and 30b can apply the electric conductive paste to the predetermined areas of the electric parts 40 more accurately.

In addition, the board-shaped electric parts 40 can be easily removed from the holding holes 10 by using the cutout portions 13, 14. Particularly, as the cutout portions 13, 14 are formed in substantially the central portions of the abutting edges 11 and 12, the board-shaped electric parts 40 can be removed more easily and stably.

In addition, since the cylindrical surface of the paste-applying wheels 33a and 33b are deformed to transfer the electric conductive pate in the grooves 33g onto both end surfaces of the electric parts 40, the electric conductive paste can be transferred stably.

In addition, since the pair of pasting wheels 33a and 33b are arranged on both sides with respect to the tape 2 in such a manner that the cylindrical surfaces of the pasting wheels 33a and 33b can sandwich the board-shaped electric parts 40, it is prevented that the electric parts 94 moves away from their desired positions when the electric conductive paste is applied thereto. Thus, the electrode may be formed more accurately. In addition, since the plurality of electrodes are formed on both end surfaces of the electric parts 40 at once, only one drying step by the drying unit 6 suffices. Thus, the electrodes can be dried uniformly, and thermal energy for the drying step, i.e., cost for the drying step can be reduced.

In addition, since the feeding speed of the tape 2 and the respective moving speeds of the cylindrical surfaces of the paste-applying wheels 33a and 33b are substantially identical with each other at least while the cylindrical surfaces are in contact with the board-shaped electric parts 40 held by the holding holes 10 of the tape 2 fed by the driving mechanisms 4a to 4d, the electric conductive paste can be transferred more stably.

In addition, since the plurality of parallel grooves 33g are formed in the cylindrical surfaces of the paste-applying wheels 33a and 33b respectively, the plurality of parallel electrodes can be formed at once.

The shape of the holding hole 10 is not limited by the above embodiment. For example, as shown in FIG. 10, the holding hole 10 may be T-shaped if the cutout portions 13, 14 are formed at the opposing end portions of the abutting edges 11, 12.

As described above, according to the invention, since the board-shaped electric parts can be held and conveyed by the abutting edges of the holding hole, the pasting unit can apply the electric conductive paste to the predetermined areas of the electric parts more accurately.

What is claimed is:

1. An electrode forming apparatus for electric parts, comprising:
    a tape having holding holes for holding board-shaped electric parts at regular intervals along a length thereof;
    a driving mechanism for feeding the tape in the direction of the length thereof;
    a pasting unit for applying electric conductive paste to the board-shaped electric parts held by the holding holes of the tape fed by the driving mechanism, in order to form a electrode;
    each of the holding holes having a top edge, a bottom edge and a pair of opposite elongated edges for abutting on both elongated opposite surfaces of each of the board-shaped electric parts, and at least one cutout portion formed in one of the elongated edges and extending in a direction perpendicular to the pair of opposite elongated edges for ease of removal of the board-shaped electric parts from the holding holes; and
    a frictional force being generated between the elongated opposite surfaces of a board-shaped electric part and the pair of opposite elongated edges in such a manner that the board-shaped electric part is held to maintain an attitude thereof while the pair of opposite elongated edges, the top edge and the bottom edge abut the elongated opposite surfaces of the board-shaped electric part, a top and a bottom of the board-shaped electric part, respectively.

2. An electrode forming apparatus for electric parts according to claim 1, wherein:
    the pasting unit has a pasting wheel having:
        an elastic cylindrical surface and
        a groove provided in the cylindrical surface, and
    the cylindrical surface of the pasting wheel is adapted to be deformed by the board-shaped electric parts held by the holding holes of the tape fed by the driving mechanism.

3. An electrode forming apparatus for electric parts according to claim 2, wherein:

the pasting wheel has a plurality of parallel grooves provided in the cylindrical surface.

4. An electrode forming apparatus for electric parts according to claim 2, wherein:

a feeding speed of the tape and a moving speed of the cylindrical surface are substantially identical with each other at least while the cylindrical surface is contact with the board-shaped electric parts held by the holding holes of the tape fed by the driving mechanism.

5. An electrode forming apparatus for electric parts according to claim 4, wherein:

the pasting wheel rotates continuously at a substantially constant speed.

6. An electrode forming apparatus for electric parts according to claim 4, wherein:

the pasting wheel rotates intermittently.

7. An electrode forming apparatus for electric parts according to claim 1, wherein:

the pasting unit has a pair of pasting wheels each of which having:
an elastic cylindrical surface and
a groove provided in the cylindrical surface, the pair of pasting wheels are arranged in such a manner that the cylindrical surfaces of the pasting wheels can sandwich the board-shaped electric parts held by the holding holes of the tape fed by the driving mechanism, and each of cylindrical surfaces of the pasting wheels is adapted to be deformed by the board-shaped electric parts held by the holding holes of the tape fed by the driving mechanism.

8. An electrode forming apparatus for electric parts according to claim 7, wherein:

a feeding speed of the tape and respective moving speeds of the cylindrical surfaces of the pair of pasting wheels are substantially identical at least while the respective cylindrical surfaces are in contact with the board-shaped electric parts held by the holding holes of the tape fed by the driving mechanism.

9. An electrode forming apparatus for electric parts according to claim 8, wherein:

the pair of pasting wheels rotate continuously at a substantially constant speed.

10. An electrode forming apparatus for electric parts according to claim 8, wherein:

the pair of pasting wheels rotates intermittently.

11. An electrode forming apparatus for electric parts according to claim 7, wherein:

each of the pasting wheels has a plurality of parallel grooves provided in the cylindrical surface.

12. An electric forming apparatus for electric parts according to claim 1, wherein:

the tape is made of paper.

13. An electric forming apparatus for electric parts according to claim 1, wherein:

the pair of abutting edges are parallel with each other.

14. An electric forming apparatus for electric parts according to claim 13, wherein:

said cutout portion is formed in a central portion of each of the abutting edges so that each of the holding holes is cross-shaped.

15. An electric forming apparatus for electric parts according to claim 13, wherein:

said cutout portion is formed in an end portion of each of the abutting edges so that each of the holding holes is T-shaped.

16. An electric forming apparatus for electric parts according to claim 1, wherein:

the tape has feeding holes at regular intervals along the length thereof and the driving mechanism has engaging means for engaging the feeding holes for feeding operation.

17. An electric forming apparatus for electric parts according to claim 1, further comprising;

a drying unit for drying the electric conductive paste applied to the board-shaped electric parts by the pasting unit.

* * * * *